United States Patent
Miret et al.

(10) Patent No.: US 9,977,065 B2
(45) Date of Patent: May 22, 2018

(54) APPARATUS AND METHOD FOR PERFORMING HIGH VOLTAGE IMPEDANCE ANALYSIS AND SHORT CIRCUIT DIAGNOSIS FOR A VEHICLE

(71) Applicant: Lear Corporation, Southfield, MI (US)

(72) Inventors: Josep Jacas Miret, Valls (ES); Marc Deumal Herraiz, Valls (ES); Jordi Borras Gargallo, Valls (ES)

(73) Assignee: Lear Corporation, Southfield, MI (US)

( * ) Notice: Subject to any disclaimer, the term of this patent is extended or adjusted under 35 U.S.C. 154(b) by 64 days.

(21) Appl. No.: 15/145,442

(22) Filed: May 3, 2016

(65) Prior Publication Data
US 2017/0322248 A1    Nov. 9, 2017

(51) Int. Cl.
| | | |
|---|---|---|
| *G01R 31/00* | (2006.01) | |
| *G01R 27/02* | (2006.01) | |
| *G01R 31/02* | (2006.01) | |
| *G07C 5/08* | (2006.01) | |

(52) U.S. Cl.
CPC .......... *G01R 31/005* (2013.01); *G01R 27/02* (2013.01); *G01R 31/025* (2013.01); *G07C 5/08* (2013.01)

(58) Field of Classification Search
CPC ............................. G01R 27/002; G01R 27/005
See application file for complete search history.

(56) References Cited

U.S. PATENT DOCUMENTS

| | | | |
|---|---|---|---|
| 2009/0179655 A1* | 7/2009 | Trenchs Magana | H02H 5/12 324/537 |
| 2009/0278547 A1 | 11/2009 | Acena et al. | |
| 2011/0049977 A1* | 3/2011 | Onnerud | B60L 3/0046 307/9.1 |
| 2012/0025768 A1 | 2/2012 | Nakano et al. | |
| 2013/0050890 A1* | 2/2013 | Rozman | H03K 17/082 361/90 |
| 2013/0106437 A1 | 5/2013 | Herraiz et al. | |
| 2013/0278272 A1 | 10/2013 | Kaminski et al. | |

(Continued)

FOREIGN PATENT DOCUMENTS

| | | | |
|---|---|---|---|
| WO | WO2013160067 A2 * | 4/2012 | ........... B60L 3/0069 |
| WO | 2013017779 A2 | 2/2013 | |
| WO | 2013160067 A2 | 10/2013 | |

OTHER PUBLICATIONS

German Office Action for Application No. 10 2617 200 4961 dated Sep. 6, 2017, 7 pages.

*Primary Examiner* — Jess Whittington
(74) *Attorney, Agent, or Firm* — Brooks Kushman P.C.

(57) ABSTRACT

In at least one embodiment, an apparatus for performing a high voltage (HV) short circuit diagnosis and an impedance analysis for a vehicle is provided. The apparatus includes a controller configured to measure a first voltage associated with a battery and a first current that varies based on a HV power net during the pre-charge operation and to perform the short circuit diagnosis based on the first voltage and the first current. The controller is further configured to determine a difference between the first voltage and a pre-charge voltage across one of a capacitor and the HV power net and to measure a second current based at least on the difference. The controller is further configured to perform the impedance analysis for the vehicle based on the second current.

20 Claims, 7 Drawing Sheets

(56) References Cited

U.S. PATENT DOCUMENTS

| | | | |
|---|---|---|---|
| 2014/0266238 A1* | 9/2014 | Furse | G01R 31/2841 324/533 |
| 2014/0306659 A1 | 10/2014 | Nakajima et al. | |
| 2015/0084404 A1* | 3/2015 | Hashim | B60L 11/18 307/9.1 |
| 2015/0251542 A1* | 9/2015 | Mensah-Brown | B60L 11/005 307/10.1 |
| 2016/0172971 A1* | 6/2016 | Schunk | H01F 7/1805 323/283 |

* cited by examiner

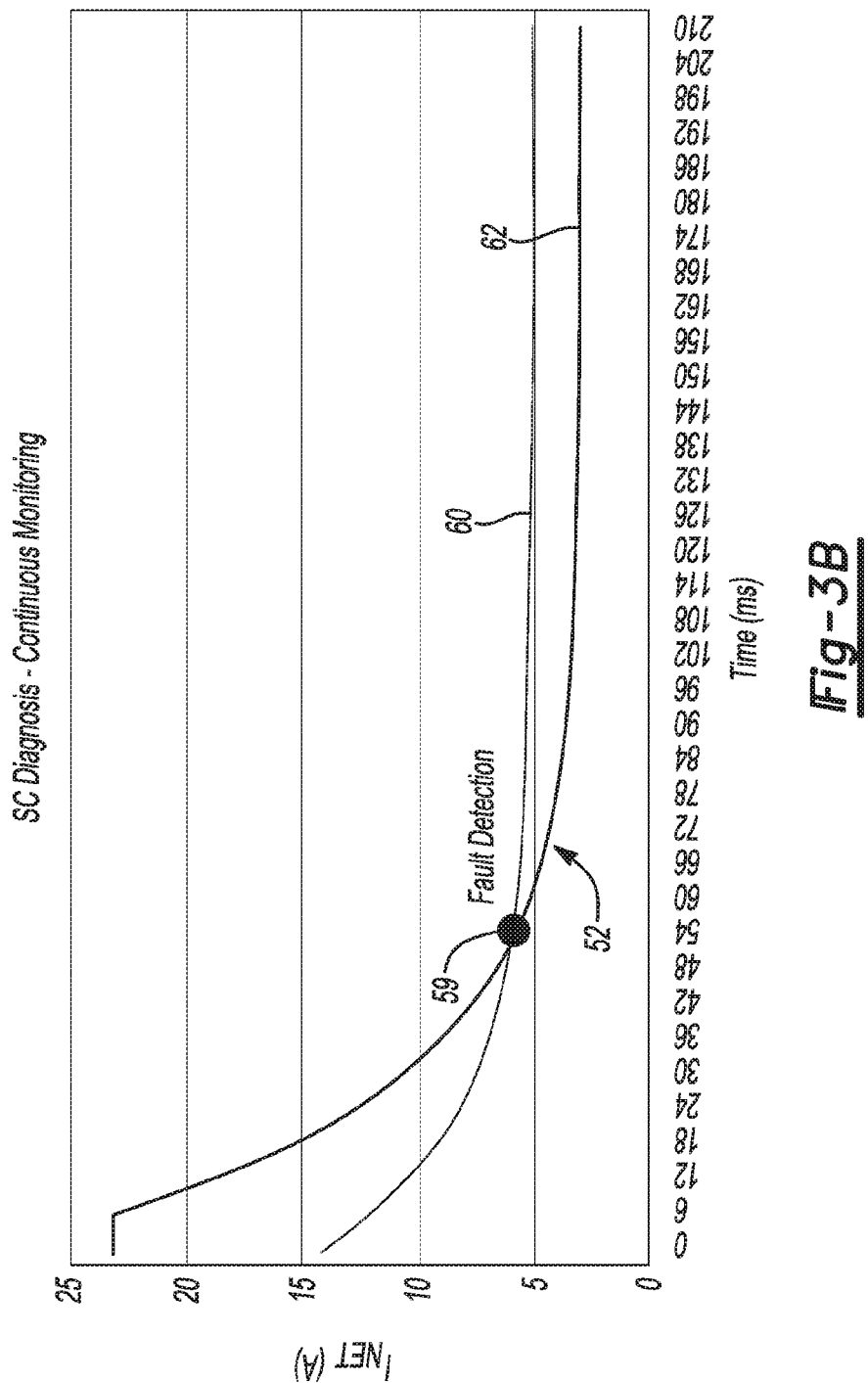

APPARATUS AND METHOD FOR PERFORMING HIGH VOLTAGE IMPEDANCE ANALYSIS AND SHORT CIRCUIT DIAGNOSIS FOR A VEHICLE

TECHNICAL FIELD

Aspects disclosed herein generally relate to an apparatus and method for performing high voltage impedance analysis and short circuit diagnosis for a vehicle while in a high voltage (HV) network pre-charge mode.

BACKGROUND

U.S. Publication No. 2013/0106437 ("the '437 publication") discloses a monitor for monitoring isolation resistance, impedance, or other isolation reflective conditions between vehicle systems. The monitor may be useful in assessing an insulation resistance between a high-voltage power net and a low-voltage power net. The monitor may be configured to assess a sufficiency of the insulation resistance based on a frequency response of the high-voltage power net.

SUMMARY

In at least one embodiment, an apparatus for performing a high voltage (HV) short circuit diagnosis and an impedance analysis for a vehicle is provided. The apparatus includes a controller for being operably coupled to a HV power net in a vehicle. The controller is configured to activate any number of switches during a pre-charge operation to power the HV power net and to measure a first voltage associated with the battery and a first current that varies based on the HV power net during the pre-charge operation. The controller is further configured to perform the short circuit diagnosis based on the first voltage and the first current during the pre-charge operation. The controller is further configured to determine a difference between the first voltage and a pre-charge voltage across one of a capacitor and the HV power net and to measure a second current based at least on the difference. The controller is further configured to perform the impedance analysis for the vehicle based on the second current.

In at least another embodiment, a method for performing a high voltage (HV) short circuit diagnosis and an impedance analysis for a vehicle is provided. The method includes activating any number of switches during a pre-charge operation to power the HV power net. The method further includes measuring a first voltage associated with a battery and a first current that varies based on the HV power net during the pre-charge operation and performing the short circuit diagnosis based on the first voltage and the first current. The method further includes determining a difference between the first voltage and a pre-charge voltage across one of a capacitor and the HV power net and measuring a second current based at least on the difference. The method further includes performing the impedance analysis for the vehicle based on the second current.

In at least one embodiment, an apparatus for performing a high voltage (HV) short circuit diagnosis and an impedance analysis for a vehicle is provided. The apparatus includes a controller configured to measure a first voltage associated with a battery and a first current that varies based on a HV power net during the pre-charge operation and to perform the short circuit diagnosis based on the first voltage and the first current. The controller is further configured to determine a difference between the first voltage and a pre-charge voltage across one of a capacitor and the HV power net and to measure a second current that varies based at least on the difference. The controller is further configured to perform the impedance analysis for the vehicle based on the the second current.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIGS. 3A-3B each depict a plot that corresponds to a detected fault in view of a corresponding threshold curve during the short circuit diagnosis in accordance to one embodiment;

DETAILED DESCRIPTION

Figure 1:
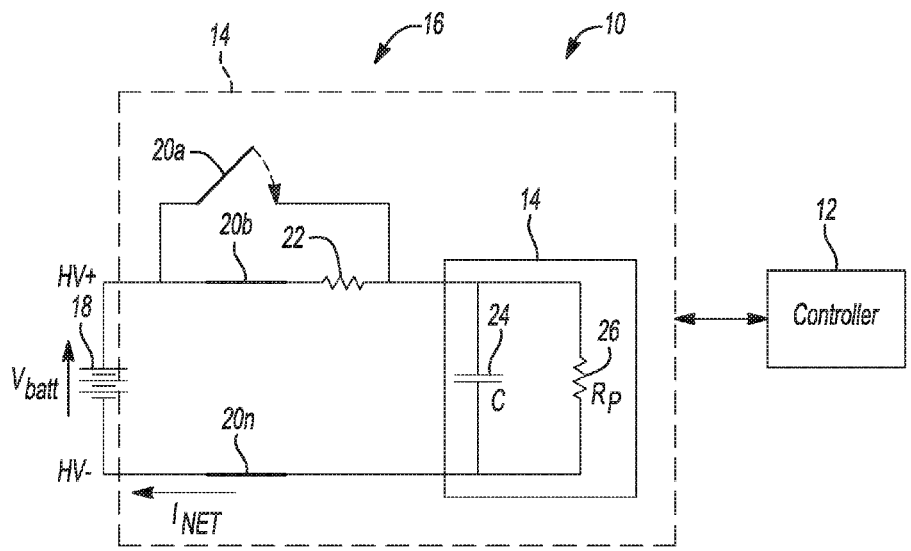
FIG. 1 depicts an apparatus for performing a high voltage (HV) low impedance analysis and a short circuit diagnosis in accordance to one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that any controller as disclosed herein may include any number of microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any controller as disclosed utilizes any one or more microprocessors to execute a computer-program that is embodied in a non-transitory computer readable medium that is programmed to perform any number of the functions as disclosed. Further, any controller as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware based inputs and outputs for receiving and transmitting data, respectively from and to other hardware based devices as discussed herein.

In general, a high voltage (HV) battery in the vehicle is switched to connect to a HV vehicle power net (e.g., various components in the vehicle that are operably coupled to the HV battery) via a HV pre-charge sequence just prior to the vehicle entering into a normal operating mode. The HV pre-charge sequence corresponds to a transient state in which the HV vehicle power net is pre-charged to match a voltage of the HV battery with limited current prior to the start of the vehicle. If there is a defect with the HV vehicle power net, such a defect may provide a-low impedance or a short circuit. These failure modes may be problematic for passengers and for various vehicle systems. Aspects disclosed herein provide an apparatus and a method to analyze or diagnose the vehicle power net impedance during the pre-charge sequence and may disconnect the battery to prevent injury. Additionally, a robust detection and reaction to the fault may also increase the overall life of the HV components in the vehicle.

In general, for a short circuit fault condition, it is desirable to quickly detect and react to this fault as such a fault may injure a vehicle passenger or damage various vehicle electrical systems and/or vehicle electronics. For the low-impedance fault condition, it is desirable to detect such a fault robustly. While the consequences of such a fault may not injure a vehicle passenger or jeopardize the vehicle systems' integrity, given the complexity of detecting a low-impedance fault, avoidance of a false detection of the low-impedance fault detection is fundamental.

FIG. 1 depicts an apparatus 10 for performing the HV impedance analysis and the short circuit diagnosis in accordance to one embodiment. The apparatus 10 includes a controller 12 and a HV power net 14. The controller 12 is electrically coupled to the HV power net 14 in a vehicle 16. The controller 12 is programmed to provide a short circuit analysis during a HV pre-charge operation. The controller 12 is configured to perform the short circuit condition diagnosis (or analysis) on the HV power net 14 when the vehicle 16 undergoes a pre-charge operation which generally occurs when the vehicle 16 is started. The vehicle 16 includes a battery 18, a plurality of switches (or contacts) 20a-20n and a pre-charger resistor 22.

The HV power net 14 includes a capacitor 24, and a first resistance 26. The HV power net 14 generally represents a physical model of capacitance and resistance values within the vehicle 12. During the HV pre-charge operation, the switch 20a is open and the controller 12 controls the switches 20b and 20n to close thereby enabling the battery 18 to provide a voltage (e.g., $V_{batt}$) through the pre-charge resistor 22. It is recognized that the controller 12 may control any number of the switches 20a-20n to be activated and/or deactivated to initialize (and enter) or exit the pre-charge operation. When the vehicle 16 exits the pre-charge operation, the vehicle 16 enters into a normal operating mode where the battery 18 supplies power directly to the HV power net 14 under normal driving conditions. The battery 18 may provide a voltage in the range of 150V-450V or other suitable voltage range. Given that the battery 18 provides a large amount of voltage to the HV power net 14, the pre-charge operation serves to minimize the amount of in-rush current that flows through the HV power net 14 when it is desirable to initially power up the HV power net 14. Specifically, the pre-charge resistor 22 serves to limit an otherwise high in-rush current that may flow to the capacitor 24. A high in-rush current may overstress the capacitor 24 and other electronics (not shown) in the vehicle 16. The pre-charge resistor 22 is configured to slow down the amount of current that flows into the HV power net 14 over time during the pre-charge operation. Over time, the capacitor 24 slowly stores the voltage from the battery 18 during the pre-charge operation. Once the capacitor 24 is fully charged, the controller 12 may then open the switch 20b while closing switch 20a to exit the pre-charge operation and to enter into normal operation (i.e., battery 18 provides power to the HV power net 14 and the vehicle 16 can be driven).

In one example, the pre-charge resistor 22 may have a resistance value of 15 Ohms (+/−5%). It is recognized that the pre-charge resistor 22 may have any number of suitable resistance values. The capacitor 24 may have a capacitance of 2 mF. Again, it is recognized that the capacitance of the capacitor 24 may vary based on the desired criteria of a particular implementation. The first resistance 26 generally corresponds to, or represents an impedance across the HV power net 14. Thus, a short circuit may be detected in the event the first resistance 26 is less than, or equal to, 100 Ohms. This condition generally corresponds to the capacitor 24 or any other component in the HV power net 14 (e.g. secondary capacitance, electronic circuits, wiring, etc.) exhibiting a short circuit condition. As noted above, it may be advantageous to detect the short circuit condition rapidly during the pre-charge operation to prevent injury. It is recognized that a short circuit fault condition can be characterized by $I_{net}$ (i.e., the current flowing through the HV power net 14) as a function of $V_{batt}$ (i.e., the voltage provided by the battery 18).

Figure 2:
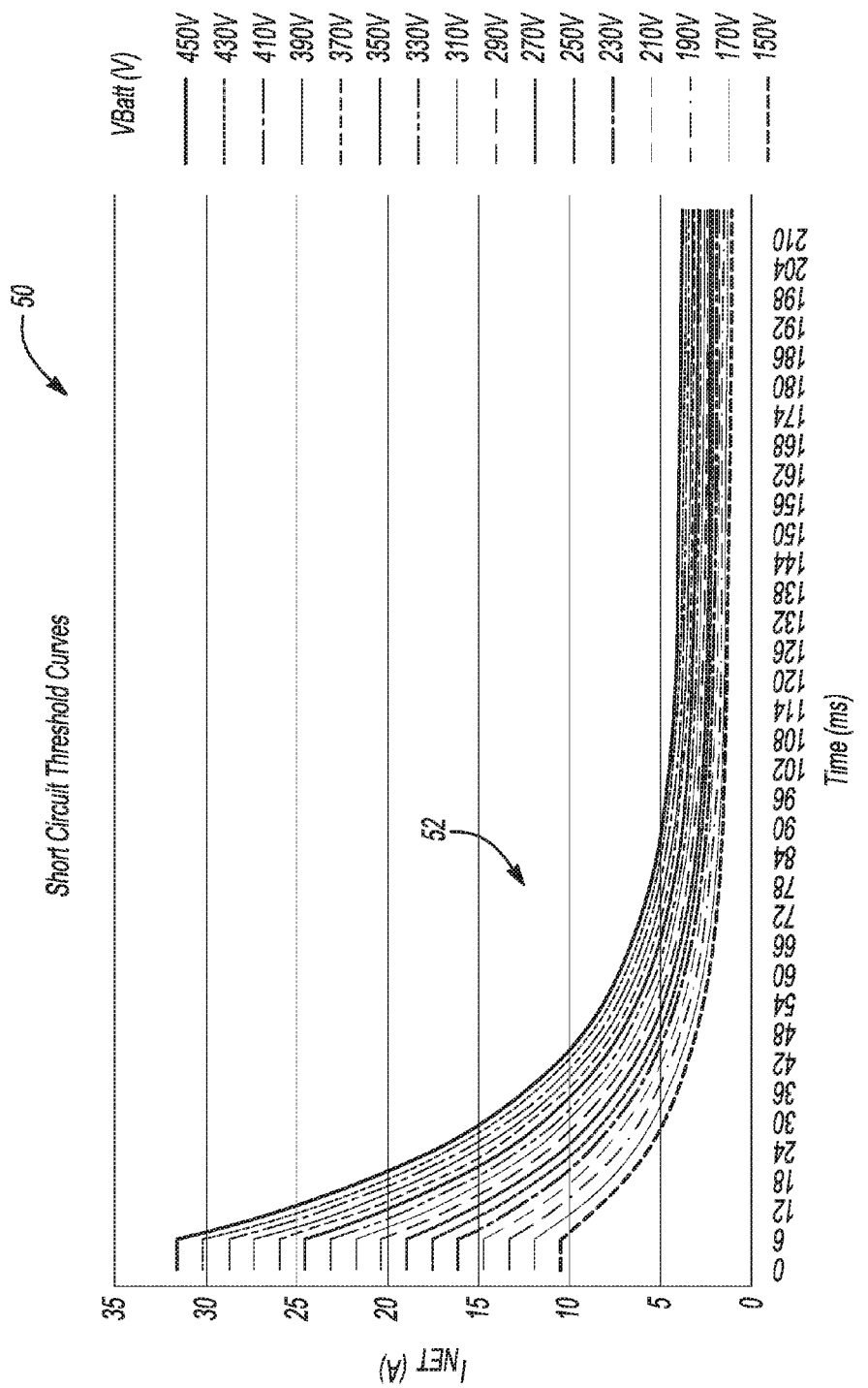
FIG. 2 depicts a plot of various threshold curves for the short circuit diagnosis in accordance to one embodiment.

FIG. 2 depicts a plot 50 of various short circuit threshold curves 52 for the short circuit diagnosis in accordance to one embodiment. For example, assuming a worst case scenario where the pre-charge resistor is 15 Ohms with a +5% tolerance and the voltage at the capacitor (or Vc) is equal to 0, a short circuit fault condition may be characterized by any one of the short circuit threshold curves 52 as illustrated in the plot 50. In general, each short circuit threshold curve 52 corresponds to a predetermined value of $I_{net}$ and a predetermined value of $V_{batt}$ for a corresponding time value (see time values on the x-axis) of the plot 50. The time value corresponds to a moment in time in which the controller 12 actually executes the short circuit diagnosis. In one example, the controller 12 may execute the short circuit analysis every 6 ms. It is recognized that the time value (e.g., 6 ms) may vary based on the desired criteria of a particular implementation. The controller 12 includes memory (not shown) for storing a first look up table that corresponds to predetermined values of $I_{net}$ and $V_{batt}$ defined by the short circuit threshold curves 52. In general, the controller 12 performs the short circuit analysis continuously and cyclically until a predetermined amount of time has been reached (e.g. 200 ms) or a voltage differs between $V_{batt}$ and the voltage in the HV power net 14 (e.g. $V_{net}$ or $V_{cap}$) is less than a predetermined voltage (e.g. 6V for various HV relays). A point in the time (e.g., generally defined as $T_{ckpoint}$) represents the time in which the voltage difference between $V_{batt}$ and the voltage in the HV power net 14 (e.g. $V_{net}$ or $V_{cap}$)) is less than a predetermined voltage. If the voltage difference threshold (e.g., 6V) is reached first, this condition generally indicates that the pre-charge process has reached a level when the switch 20a may be closed safely to energize the HV network 14. But prior to that, the controller 12 ensures that the battery 18 may not be unexpectedly discharged and therefore the controller 12 starts the low-impedance-threshold which will be discussed in more detail below. The current measurement at this moment is compared to a pre-stored current value in memory (not shown)) of controller 12 for the measured $V_{batt}$.

On the contrary, if the time limit is reached (e.g., 200 ms) (with the voltage difference being greater than 6V), the controller 12 determines that there is a lower resistance in the HV power net 14 (e.g., even lower than what would have been compared with respect to a low-impedance-threshold comparison as performed in connection with a low impedance test by the controller 12). Although this is not a short circuit, there is unexpected high current drain in the HV power net 14 and there may be a risk of a fast battery discharge.

Apart from that, as pre-charging current behaves exponentially, after a series of $I_{net}$ measurements, the controller 12 may mathematically forecast the behavior of $I_{net}$ and conclude, at that moment in advance, that short-circuit threshold may not be reached. Then short-circuit threshold cyclic comparison may be concluded either prior to the expiration of the predetermined amount of time (200 ms) or when the voltage-difference-threshold (e.g. 6V) is reached. The controller 12 may then focus on a comparison of these two thresholds (time and voltage difference).

Figure 3A:
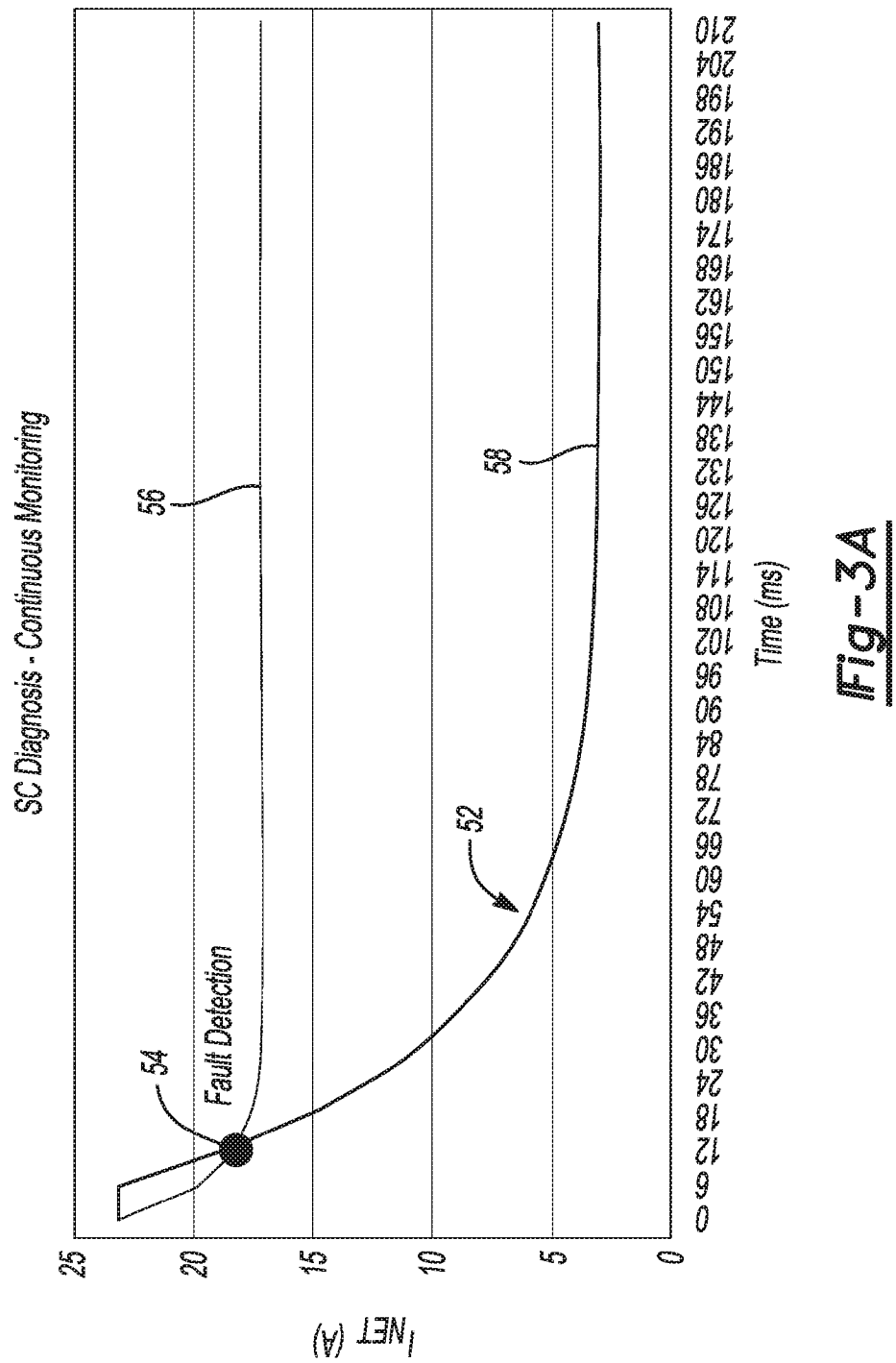

FIG. 3A illustrates one example of measured $I_{net}$ values in reference to a series of time values where a short circuit fault is present at point 54. Waveform 56 generally corresponds to the measured values of $I_{net}$ in a single short circuit threshold curve 52. Waveform 58 generally corresponds to a single short circuit threshold curve 52. In this example, the controller 12 measures $I_{net}$ at roughly 18 A at the 14 millisecond mark (see x-axis) at point 54. As shown, and as time increases (e.g., every 6 ms), the measured $I_{net}$ values exceed or are greater than the values that comprise the short circuit threshold curve 52 in FIG. 2. The controller 12 provides continuous monitoring for the short circuit ground fault condition during the pre-charge operation. The controller 12 quickly determines that a short circuit ground fault is present at point 54 and disconnects the battery 18 in response to detecting the short circuit ground fault. In general, point 54 generally indicates that the measured $I_{net}$ value exceeds the in-rush current flowing into the HV power net 14.

FIG. 3B illustrates one example of measured $I_{net}$ values in reference to a series of time values where a short circuit fault is present at point 59. Waveform 60 generally corresponds to the measured values of $I_{net}$ in a single short circuit threshold curve 52. In this example, the controller 12 measures $I_{net}$ at roughly 6 A at the 54 millisecond mark (see x-axis) at point 59. As shown, and as time increases (e.g., every 6 ms), the measured $I_{net}$ values exceed or are greater than the values that comprise the short circuit threshold curve 52 in FIG. 2. The controller 12 provides continuous monitoring for the short circuit ground fault condition during the duration of the pre-charge operation by measuring $I_{net}$. The controller 12 quickly determines that a short circuit ground fault is present at point 59. In general, point 59 generally indicates that the measured $I_{net}$ value exceeds the in-rush current flowing into the HV power net 14 and may disable the battery 18 in response to detecting the short circuit ground fault. In general, once the controller 12 determines that a fault is present, the controller 12 aborts the pre-charge operation by opening the switches 20b and 20n. As noted above, point 59 generally indicates that the measured $I_{net}$ value exceeds the in-rush current flowing into the HV power net 14.

Referring back to FIG. 1, the controller 12 is also configured to perform a low impedance analysis on the HV power net 14. The controller 12 is configured to perform the low impedance analysis on the HV power net 14 at a time just prior to the expiration of the pre-charge operation. Specifically, the controller 12 initiates the low impedance analysis when a difference between $V_{batt}$ and $V_c$ (i.e., the voltage across the capacitor 24) or $V_{net}$ (i.e., the voltage across the HV power net 14) is less than, or equal to, but not limited to, 6V. When the difference between $V_{batt}$ and $V_c$ is less than, or equal to 6V, this condition generally corresponds to a point in time where it is safe to close the switch 20a and to open the switch 20b (while keeping the switch 20n closed) to deactivate the pre-charge operation. If the controller 12 attempted to close the switch 20a and open the switch 20b prior to difference of $V_{batt}$ and $V_c$ (or $V_{net}$) being less than, or equal to the predetermined voltage, the switch 20a may experience arching or other malfunction upon closing. In general, the controller 12 initiates the low impedance analysis when the difference between $V_{batt}$ and $V_c$ (or $V_{net}$) is less than, or equal to 6V (or some other predetermined voltage value). However, it should be noted that the controller 12 does not close the switch 20a and open the switch 20b to exit the pre-charge operation until the low impedance analysis is actually performed. As also indicated above, the controller 12 may also initiate the low impedance analysis in the event the voltage difference threshold (e.g., 6V) is not met upon the predetermined time limit reaching, for example, 200 ms.

The controller 12 may determine that the HV power net 14 is experiencing a low-impedance fault if the first resistance 26 is detected to have a resistance value less than or equal to 1500 Ohms and greater than 100 Ohms. The HV power net 14 may exhibit a low-impedance range due to the aging of various electrical/electronic components that form the HV power net 14. In general, at the beginning of the pre-charge operation, the HV power net 14 may have a high amount of in-rush current. Conversely, near the end or at the end of the pre-charge operation, the HV power net 14 may have a low in-rush current.

Figure 4:
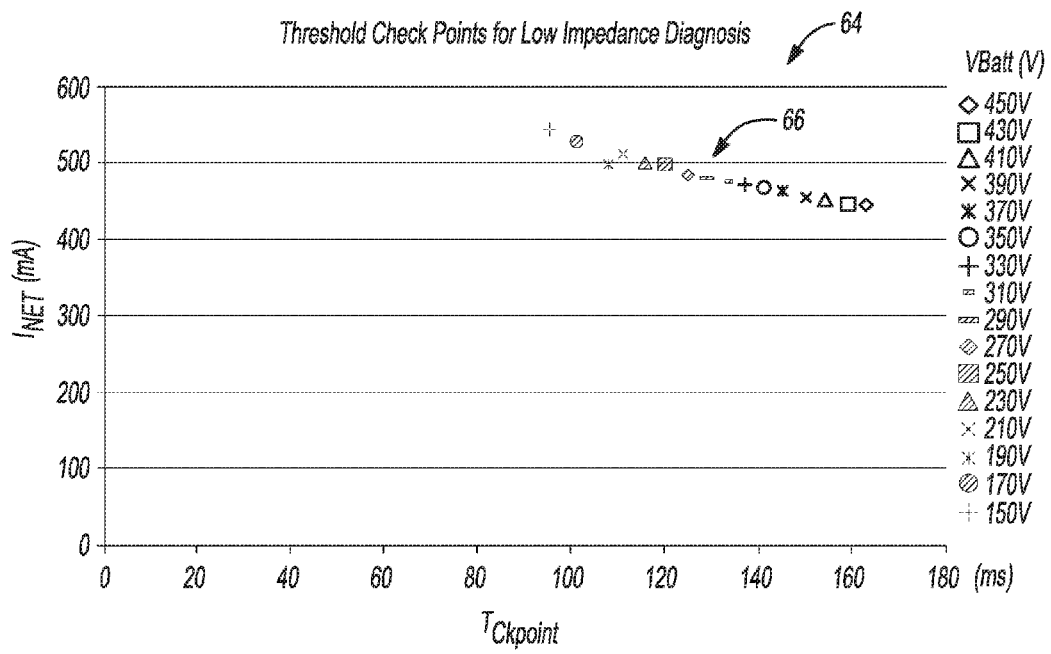
FIG. 4 depicts a plot of various current thresholds for the low impedance analysis in accordance to one embodiment.

FIG. 4 depicts a plot 64 for various low impedance threshold checkpoints 66 for the low impedance analysis in accordance to one embodiment. In general, each low impedance threshold checkpoint 66 corresponds to a predetermined value of $I_{net}$ and a predetermined value of $V_{batt}$ at a specific time (e.g., $t_{ckpoint}$), where the specific time corresponds to a point in time in which the controller 12 executes the low impedance analysis. The memory of the controller 12 also stores a second look up table that corresponds to the values defined by the low impedance threshold checkpoints 66. As noted above, when the controller 12 determines that a difference between $V_{batt}$ and $V_c(t)$ is less than, or equal to a predetermined voltage, this condition corresponds to the specific time (e.g., $t_{ckpoint}$) in which the controller 12 initiates the low impedance analysis.

Figure 5A:
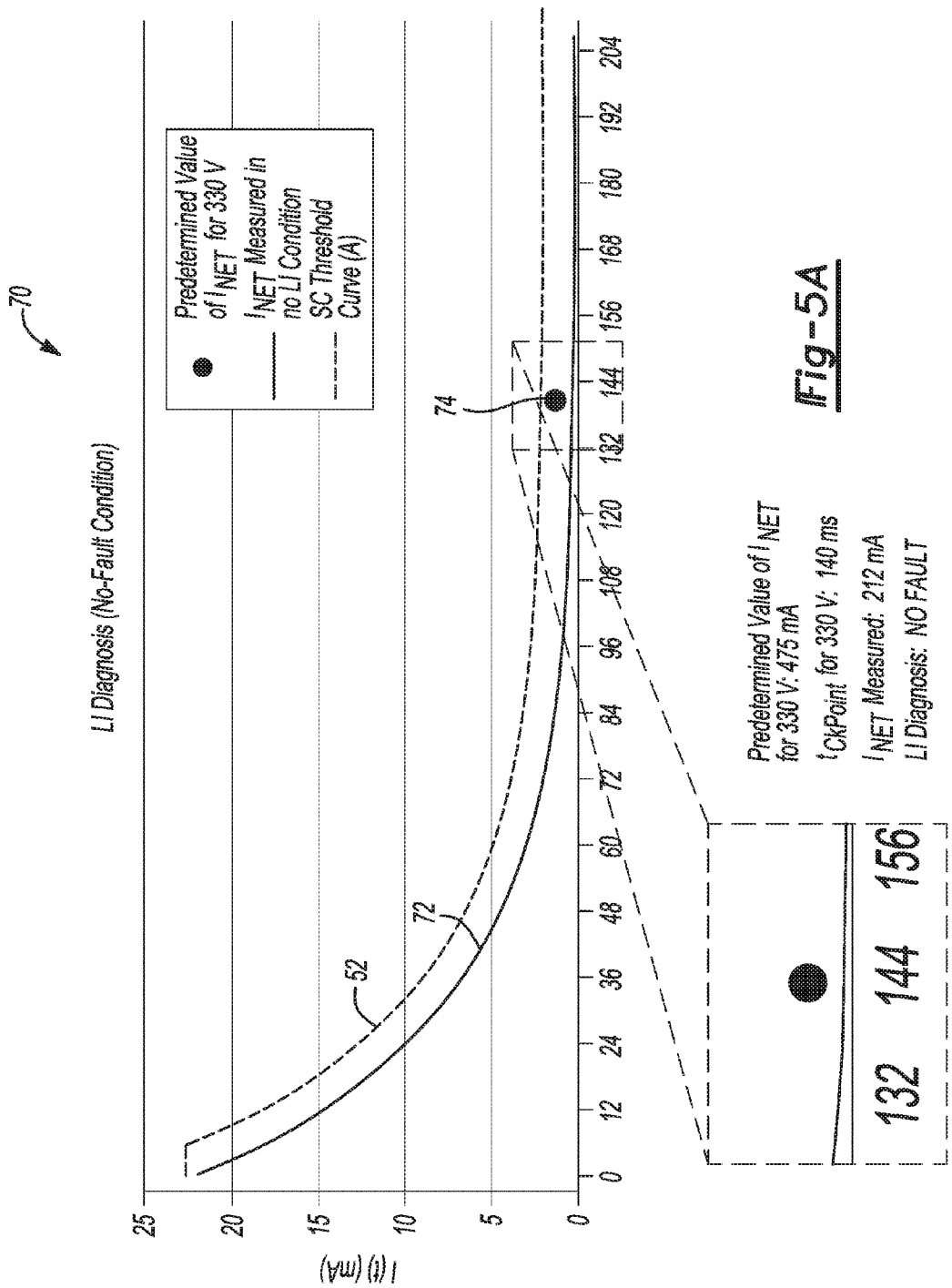
FIGS. 5A-5B each depict a plot that corresponds to a no-fault condition and to a fault condition, respectively, during the low impedance analysis in accordance to one embodiment.

FIG. 5A depicts a plot 70 including a waveform 72 that exhibits a non-fault condition 74 during the low impedance diagnosis in accordance to one embodiment. The controller 12 performs the low impedance analysis at the specific time (or $t_{ckpoint}$) of 140 ms and measures $I_{net}$ at 212 mA and $V_{batt}$ at 330V. As shown in FIG. 4, when $V_{batt}$ is equal to 330V, the expected or predetermined current threshold value for $I_{net}$ is 475 mA. Given that the measured value for $I_{net}$ is 212 mA and that this is less than the predetermined current threshold value of 475 mA, the controller 12 determines that a fault is not present. Waveform 72 illustrates that there is an acceptable amount of current flowing into the HV power net 14 from the battery 18. The waveform 52 as illustrated in FIG. 5A corresponds to a short circuit threshold curve 52 for $V_{batt}$ at 330V and this is provided for illustrative purposes. In general, the current values compared while using the waveform 52 are in the Amp range, whereas the current values compared while using the waveform 72 are in the milliamperes range.

Figure 5B:
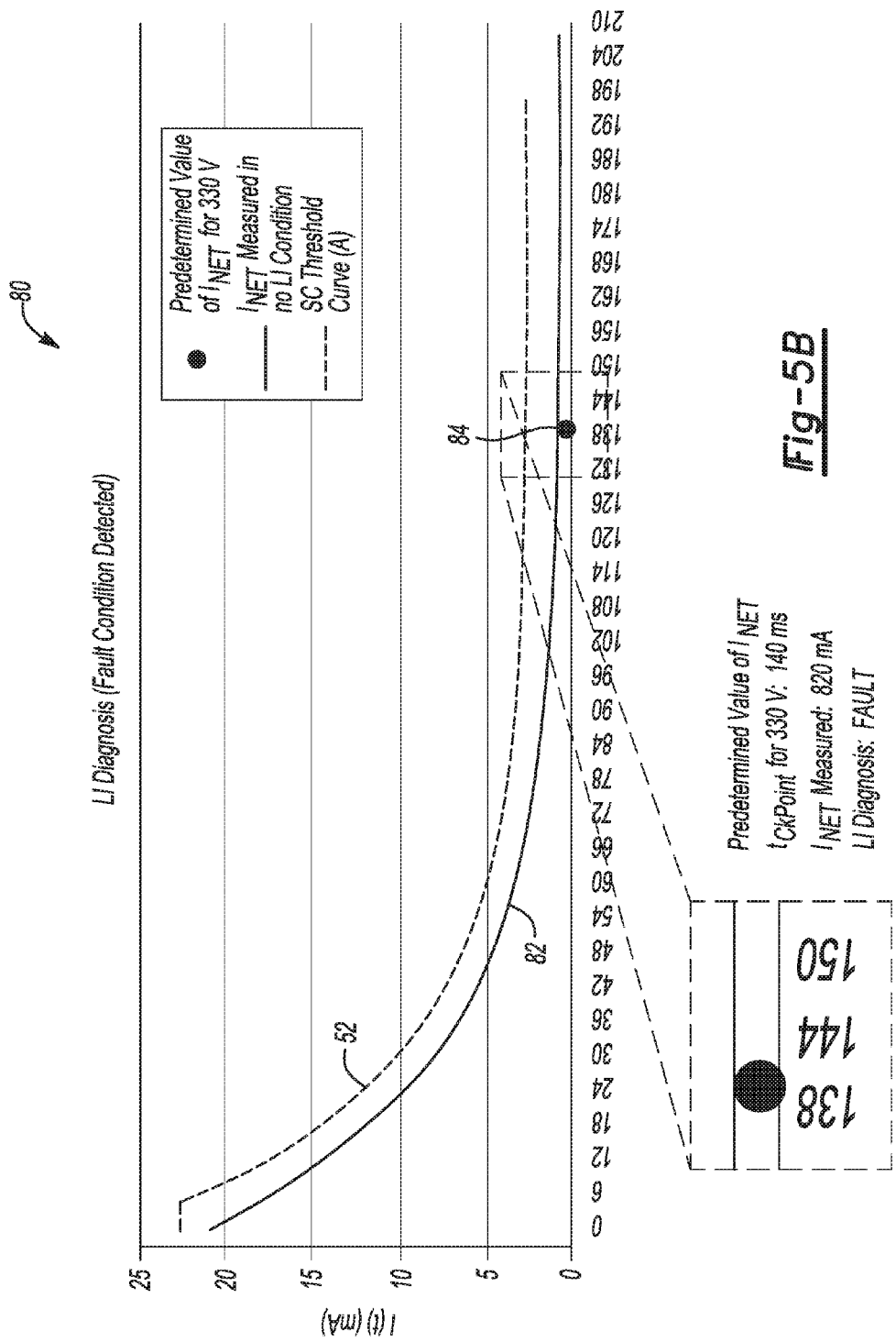

FIG. 5B depicts a plot 80 including a waveform 82 that exhibits a fault condition 84 during the low impedance diagnosis in accordance to one embodiment. The controller 12 performs the low impedance analysis at the specific time (or $t_{ckpoint}$) of 140 ms and measures $I_{net}$ at 820 mA and $V_{batt}$ at 330V. As shown in FIG. 4, when $V_{batt}$ is equal to 330V, the expected or predetermined current threshold value for $I_{net}$ is 475 mA. Given that the measured value for $I_{net}$ is 820 mA and this value is greater than the predetermined current threshold value of 475 mA, the controller 12 determines the HV power net 14 is exhibiting a low impedance fault. Waveform 82 illustrates that there is too much current flowing into the HV power net 14 from the battery 18 indicating too low of an impedance in the HV power net 14. In this case, the controller 12 exits the pre-charge operation and a warning is transmitted from the controller 12 to other controllers (not shown) in the vehicle 16 prior to having the battery 18 being directly connected to the HV power net 14 where an energy management electronic control system will determine whether such a connection is performed. The waveform 52 as illustrated in FIG. 5A corresponds to a short circuit threshold curve 52 for $V_{batt}$ at 330V and this is provided for illustrative purposes. In general, the current values compared while using the waveform 52 are in the Amp range, whereas the current values compared while using the waveform 72 are in the milliamperes range.

Figure 6:
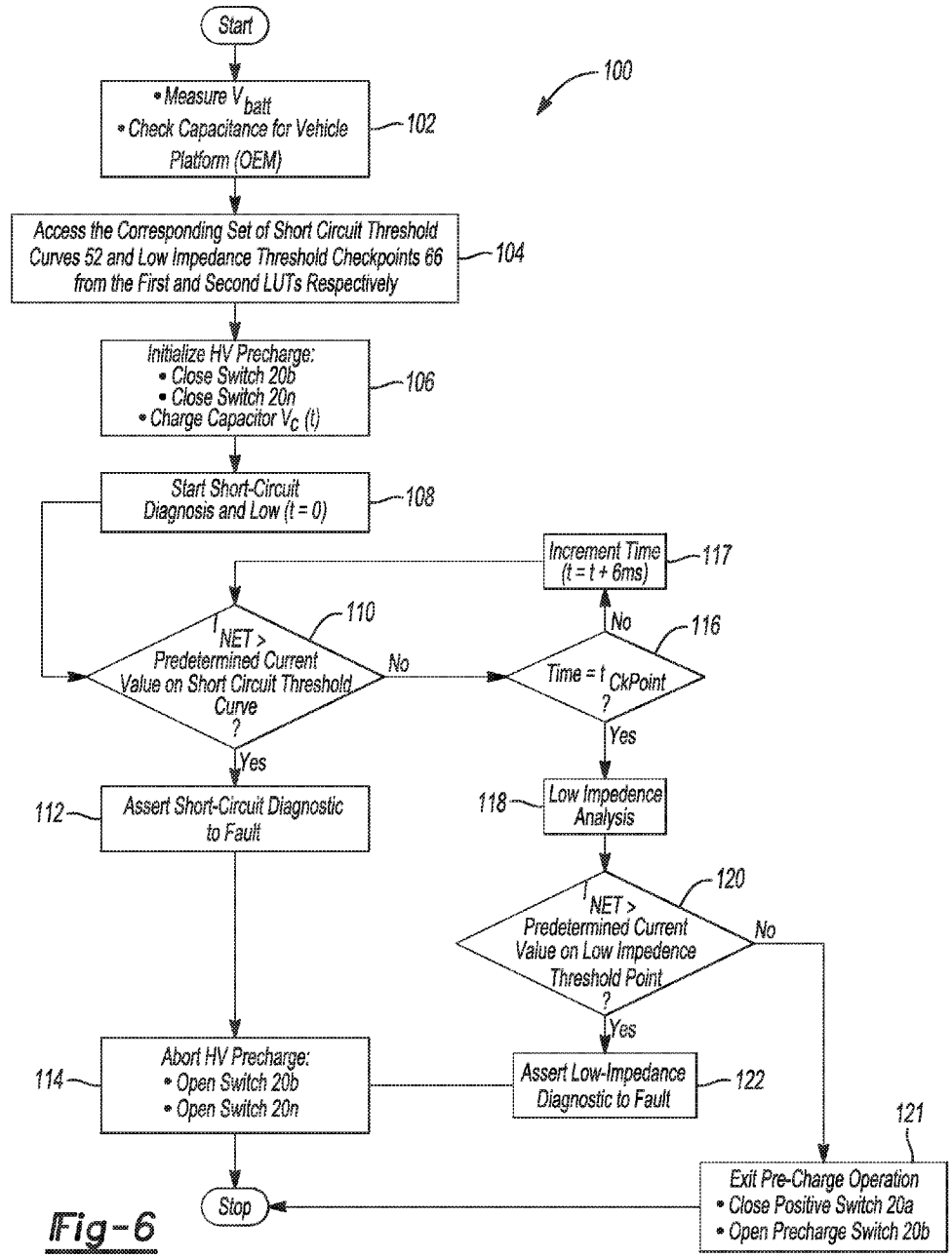
FIG. 6 depicts a method for performing the HV impedance analysis and the short circuit diagnosis for the vehicle in accordance to one embodiment.

FIG. 6 depicts a method 100 for performing the HV impedance analysis and the short circuit diagnosis for the vehicle 16 in accordance to one embodiment.

In operation 102, the controller 12 measures $V_{batt}$ for the vehicle 16 and the controller 12 checks the capacitance for the capacitor 24 for a particular vehicle platform during the pre-charge operation. In general, the controller 12 may be generally arranged to include any number of capacitance values for the capacitor 24 that each correspond to different vehicle platforms. It is recognized that the capacitance used for each vehicle platform may vary based on the desired criteria of a particular implementation. This information may be downloaded into the memory of the controller 12 at a particular vehicle manufacturing facility to correspond to the desired vehicle platform. The controller 12 measures $V_{batt}$ after the controller 12 is provided with the capacitance for the particular vehicle platform.

In operation 104, the controller 12 accesses the corresponding set of short circuit threshold curves 52 and the low impedance threshold checkpoints 66 for the corresponding vehicle platform. The set of short circuit threshold curves 52 and the low impedance threshold checkpoints 66 may each vary based on the vehicle platform the controller 12 is positioned on as each of the vehicle platforms may include different sets of electrical/electronic components that comprise the HV power net 14. Based on the foregoing, different levels of first and second look up tables (LUTs) are provided in the memory of the controller 12. The first and second LUTs include the short circuit threshold curves 52 and the low impedance threshold checkpoints 66, respectively.

In operation 106, the controller 12 initializes the pre-charge operation by controlling the switches 20b and 20n to close.

In operation 108, the controller 12 initiates or starts the short-circuit condition diagnosis at an initial time (e.g., t=0).

In operation 110, the controller 12 measures $I_{net}$ and compares the same against the corresponding predetermined current threshold value on the corresponding short circuit threshold curve 52, where the corresponding short circuit threshold 52 is selected based on the measured value of $V_{batt}$. If the controller 12 determines that $I_{net}$ is greater than the predetermined current threshold values on the corresponding short circuit threshold curve 52, then the method 100 moves to operation 112. If not, then the method 100 moves to operation 116.

In operation 112, the controller 12 determines that there is a short circuit analysis fault with the HV power net 14.

In operation 114, the controller 12 aborts or discontinues the pre-charge operation and opens the switches 20b and 20n to disconnect the battery 18 from the HV power net 14.

In operation 116, the controller 12 determines whether the time, t is equal to $t_{ckpoint}$. As noted above, this condition is true when the controller 12 determines that a difference between $V_{batt}$ and $V_c$ or $V_{net}$ is less than, or equal to a predetermined voltage (e.g., 6V). If the difference between $V_{batt}$ and $V_c$ (or $V_{net}$) is less than, or equal to the predetermined voltage (i.e., time, t is equal to $t_{ckpoint}$), then the method 100 moves to operation 118 to perform the low impedance analysis. If not, then the method 100 moves to operation 117. While not shown, the controller 12 may also determine whether the predetermined time limit has expired if the difference between $V_{batt}$ and $V_c$ (or $V_{net}$) remains greater than the predetermined voltage. If the controller 12 determines that the predetermined time limit has expired and if the difference between $V_{batt}$ and $V_c$ (or $V_{net}$) remains greater than the predetermined voltage, then the controller 12 proceeds to perform the low impedance analysis as set forth in operation 118.

In operation 117, the controller 12 increments the time, t by a predetermined time value (e.g., 6 ms) and moves back to operation 110. In this case, it is too early to initiate the low-impedance diagnosis.

In operation 118, the controller 12 performs the low impedance analysis.

In operation 120, the controller 12 measures $I_{net}$ and compares the same against the corresponding predetermined current threshold value on the corresponding low impedance threshold checkpoint 66, where the corresponding low impedance threshold point 66 is selected based on the measured $V_{batt}$ value. If the controller 12 determines that $I_{net}$ is greater than the predetermined current threshold values on the corresponding low impedance threshold point 66, then the method 100 moves to operation 122. If not, then the method 100 moves to operation 121.

In operation 121, the controller 12 controls the switch 20a to close and the switch 20b to open while keeping the switch 20n closed so that the vehicle 16 exits from the pre-charge operation to start the normal operating mode. In the normal operating mode, the vehicle 16 can be driven by the driver. During the pre-charge operation, the driver will not be able to drive the vehicle 16 until the vehicle 16 enters into the normal driving mode.

In operation 122, the controller 12 determines that there is a low impedance diagnostic fault with the HV power net 14 and moves to operation 104 to abort the pre-charge operation.

While various embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for performing a high voltage (HV) short circuit diagnosis and an impedance analysis for a vehicle, the apparatus comprising:
a controller configured to be coupled to a HV power net in a vehicle, the controller being further configured to:
activate any number of switches during a pre-charge operation to power the HV power net;
measure a first voltage associated with a battery and a first current that varies based on the HV power net during the pre-charge operation;
perform the HV short circuit diagnosis based on the first voltage and the first current during the pre-charge operation;
determine a difference between the first voltage and a pre-charge voltage across one of a capacitor and the HV power net;
measure a second current based at least on the difference; and
perform the impedance analysis for the vehicle based on the second current.

2. The apparatus of claim 1 wherein the controller is further configured to activate the any number of switches during the pre-charge operation to charge the capacitor during the pre-charge operation and to provide the pre-charge voltage prior to the vehicle being driven.

3. The apparatus of claim 1 wherein the controller is further configured to measure the second current in response to the difference being less than, or equal to a predetermined voltage.

4. The apparatus of claim 1 wherein the controller is further configured to measure the second current during the pre-charge operation.

5. The apparatus of claim 1 wherein the controller is further configured to compare the first current to a predetermined current threshold value on a first short circuit threshold curve of a plurality of short circuit threshold curves during the HV short circuit diagnosis.

6. The apparatus of claim 5 wherein the controller is further configured to abort the pre-charge operation in response to the first current being greater than the predetermined current threshold value.

7. The apparatus of claim 5 wherein the controller includes memory for storing the plurality of short circuit threshold curves in a look up table.

8. The apparatus of claim 1 wherein the controller is further configured to perform the HV short circuit diagnosis based on the first voltage and on the first current at regular and continuous time intervals during the pre-charge operation.

9. The apparatus of claim 1 wherein the controller is further configured to compare the second current to a predetermined current threshold value on a first low impedance threshold checkpoint of a plurality of low impedance threshold checkpoints during the impedance analysis.

10. The apparatus of claim 9 wherein the controller includes memory for storing the plurality of low impedance threshold checkpoints in a look up table.

11. A method for performing a high voltage (HV) short circuit diagnosis and an impedance analysis for a vehicle, the method comprising:
activating any number of switches during a pre-charge operation to power the HV power net;
measuring a first voltage associated with a battery and a first current that varies based on the HV power net during the pre-charge operation;
performing the HV short circuit diagnosis based on the first voltage and the first current during the pre-charge operation;
determining a difference between the first voltage and a pre-charge voltage across one of a capacitor and the HV power net;
measuring a second current based at least on the difference; and
performing the impedance analysis for the vehicle based on the second current.

12. The method of claim 11 further comprising charging the capacitor during the pre-charge operation to provide the pre-charge voltage prior to the vehicle being driven in response to activating the any number of switches.

13. The method of claim 11 further comprising measuring the second current during the pre-charge operation.

14. The method of claim 11 further comprising measuring the second current in response to the difference being less than, or equal to a predetermined voltage.

15. The method of claim 11 further comprising comparing the first current to a predetermined current threshold value on a first short circuit threshold curve of a plurality of short circuit current threshold curves during the HV short circuit diagnosis.

16. The method of claim 15 further comprising aborting the pre-charge operation in response to the first current being greater than the predetermined current threshold value.

17. The method of claim 15 further comprising storing the plurality of short circuit current threshold curves in a look up table.

18. The method of claim 11 further comprising performing the HV short circuit diagnosis based on the first voltage and on the first current at regular and continuous time intervals during the pre-charge operation.

19. The method of claim 11 further comprising comparing the second current to a predetermined current threshold value on a first low impedance threshold checkpoint of a plurality of low impedance threshold checkpoints during the impedance analysis.

20. An apparatus for performing a high voltage (HV) short circuit diagnosis and an impedance analysis for a vehicle, the apparatus comprising:
a controller configured to:
measure a first voltage associated with a battery and a first current that varies based on a HV power net during a pre-charge operation;
perform the HV short circuit diagnosis based on the first voltage and the first current during the pre-charge operation;
determine a difference between the first voltage and a pre-charge voltage across one of a capacitor and the HV power net;
measure a second current that varies based at least on the difference; and
perform the impedance analysis for the vehicle based on the second current.

* * * * *